United States Patent [19]

Siffert et al.

[11] 3,999,071
[45] Dec. 21, 1976

[54] NUCLEAR DETECTORS SENSITIVE TO ALPHA, BETA, AND GAMMA RAYS AND TO THERMAL NEUTRONS AND TO METHODS OF TREATMENT OF CRYSTALS OF SUCH DETECTORS

[75] Inventors: Paul M. Siffert, Strasbourg; Alain G. Cornet, Mundolsheim; Raymond T. Regal, Vendenheim; Robert G. Triboulet, Meudon; Yves M. Marfaing, Paris, all of France

[73] Assignee: Etat Francais, Paris, France

[22] Filed: Aug. 26, 1975

[21] Appl. No.: 607,873

[52] U.S. Cl. ............................... 250/370; 250/390
[51] Int. Cl.² .......................................... G01T 1/22
[58] Field of Search ........................... 250/370, 390

[56] References Cited

UNITED STATES PATENTS

| | | | |
|---|---|---|---|
| 3,598,997 | 8/1971 | Baertsch | 250/370 |
| 3,665,190 | 5/1972 | Kotera et al. | 250/370 |

*Primary Examiner*—Harold A. Dixon
*Attorney, Agent, or Firm*—Haseltine, Lake & Waters

[57] ABSTRACT

A nuclear detector in which a semi-conductor crystal of cadmium telluride is utilized. The crystal has high resistivity greater than $10^5 \Omega$cm and permits the detector to be used in measuring alpha, beta and gamma rays as well as thermal neutrons. The crystal is treated to be of MOS or MIS type to avoid polarization phenomena.

10 Claims, 6 Drawing Figures

NUCLEAR DETECTORS SENSITIVE TO ALPHA, BETA, AND GAMMA RAYS AND TO THERMAL NEUTRONS AND TO METHODS OF TREATMENT OF CRYSTALS OF SUCH DETECTORS

FIELD OF THE INVENTION

The present invention relates to a nuclear detector sensitive to alpha, beta, and gamma rays, and to thermal neutrons. The invention also relates to the treatment of semi-conductor crystals used in such detectors to obviate polarization phenomena.

BACKGROUND OF THE INVENTION

Apparatus utilized for the detection of neutrons can be divided into two major categories: detectors for slowly traveling neutrons and detectors for rapidly traveling neutrons.

In general, the detectors are adapted to a range of energy and one cannot use them interchangeably for the measure of neutrons from one or the other category.

The slow neutron detectors comprise ionization chambers and proportional counters. These detectors contain boron ($^{10}B$) either in the form of deposits on the walls or the electrodes of the detectors or in gaseous form in the case of counters of boron trifluoride ($BF_3$).

With this type of detector one counts the alpha particles ($4_He$) emitted at the moment of interaction of a thermal neutron with a boron atom ($^{10}B$).

In the presence of a large amount of gamma noise, it is preferable to utilize the phenomena of fission of $U^{235}$ or of $Pu^{239}$ to be able to ionize the fission fragments (greater than those of alpha particles).

The detectors activated by slow neutrons are constructed from elements in the form of sheets which have large areas for interaction (neutron, gamma). The essential interest of this type of detector resides in its insensitivity to gamma rays as well as in its simple construction. Its major disadvantage is in not emitting a direct and continuous reading.

Included in the category of slow neutron detectors are scintillation counters obtained by the association of scintillators of very high efficiency and photomultipliers.

Included in the category of rapid neutron detectors are elastic diffusion detectors, exo-energetic reaction detectors threshold detectors and armored detectors.

The elastic diffusion detector utilizes essentially diffusion (neutron, proton) in a hydrogen medium.

The exo-energetic reaction detector utilizes lithium ($^6Li$) in scintillators or the type LiI (T1) associated with a photomultiplier and in the form of thin layers disposed between two semi-conductors of silicon.

With this type of reaction one can also utilize a rare gas ($^3He$) either in a proportional counter or in a narrow chamber provided between two detectors of charged particles.

The relatively high values of Q of these reactions permit good discrimination from the background gamma noise.

The detectors for threshold reactions only act on neutrons having an energy greater than a certain value. These reactions are of three orders: fission, reaction ($n,p$) or ($n,\alpha$) or ($n,2n$), and non-elastic diffusions.

Armored detectors utilize detectors of the type previously described for the detection of slow or thermal neutrons and they are completely surrounded by a moderator material for measuring rapid neutrons.

It is also necessary to underline that the neutron counters which have just been discussed are generally specific in the sense that they are poorly adapted to the counting of other rays (alpha, beta, gamma).

The technological examination of nuclear detectors which has been previously described demonstrates that there does not exist at the present time portable detectors of small size which require for their operation low electrical voltages while furnishing an immediate response for any type of ray.

In fact, apparatus for radio protection are always constituted either of large assemblies associated with scintillator probes or Geiger Muller tubes very slightly sensitive to gamma rays and insensitive to neutrons (except for special tubes).

The first type of apparatus necessitates high voltages of the order of several hundreds of volts as well as operation with different scintillators for each type of particle. The second type do not have great efficiency.

SUMMARY OF THE INVENTION

An object of the present invention is to provide a detector which overcomes the disadvantages associated with the prior art detector and contemplates a small apparatus capable of counting with great efficiency and simultaneously the four types of nuclear rays which exist in nature.

A further object of the invention is to provide a method of treatment of the detector which eliminates the polarization phenomena which in the conventional counters is translated into a progressive degradation of their performance.

To this effect the invention provides a very rugged nuclear detector which comprises:
  a crystal of cadmium telluride (CdTe) of high resistivity and sensitive to alpha, beta and gamma rays as well as thermal neutrons,
  electrodes disposed on each of the parallel faces of said crystal,
  an elastic contact element applied between the first of the electrodes and a conductive plate which bears through the intermediary of an insulating plate on a conductive base serving for the support of the detector,
  a coaxial connector mounted in the base with a central pole connected to the conductive plate,
  insulating means for maintaining and centering the crystal in a conductive casing which is mounted on the base and
  a seal of elastic and conductive material interposed between the edge of a window mounted in the casing and surrounding the second electrode.

The crystal of cadmium telluride is a semi-conductive material which offers a number of advantages over other materials utilized in the construction of semi-conductive nuclear detectors. Its high atomic number gives to it an effectivity of photoelectric detection of substantial magnitude.

The material also offers the advantage of operating at ambient temperature due to an elevated forbidden gap of 11.45 ev, thus being very effective for alpha, beta, and gamma rays and while being very sensitive to thermal neutrons.

In effect, contrary to conventional semi-conductor counters (silicon, germanium) which are sensitive to only alpha, beta, and gamma rays, in CdTe diodes the thermal neutrons can also be detected by nuclear reaction $^{113}Cd(n,\gamma)^{114}Cd$.

The isotope $^{113}Cd$ which is present in the amount of 12.26% in the composition of natural cadmium gives at the time of this reaction provides a very substantial sectional efficiency of the order of 20,000 barns. As a consequence, the thermal neutrons will be "transformed" with a very great probability to gamma rays at the level of the counter which will detect them with great effectiveness.

Furthermore, the crystal can be treated, as will be indicated hereafter, to obtain suitable contacts eliminating the phenomena of polarization.

According to one embodiment of the invention, the electrodes have surfaces intimately bonded to the active respective faces of the crystal and each include an edge detached to receive the mechanical contact pressures either with the elastic member or with the seal.

Useful results have been obtained with electrodes of conductive materials selected from the group consisting of silicon, copper, platinum, gold, palladium and their alloys.

According to another embodiment, the elastic element is a braided cushion of gilded bronze filaments. It allows a rigid mounting which resists substantial accelerations.

The penetration of the rays into the detector is obtained under the best conditions by a window which comprises, for example, a sheet of thin aluminum or of metallized nylon embedded in the coall of the casing.

The invention extends also to a process of fabrication of the counter from cadmium telluride material compounded or not. It does not necessarily have a monocrystalline structure but can be formed from a plurality of crystals. It has a high resistivity in order to permit obtaining even with low voltages substantial zones of sensitivity.

A further object of the present invention is to provide a process for treatment of crystals of cadmium telluride utilized in such detectors in order to eliminate polarization phenomena. The polarization phenomena which appears in detectors made from cadmium telluride compounded with chlorine results in a progressive degradation in performance of the apparatus over a period of time.

The polarization leads, on the one hand, to a reduction of efficiency of the detector (that is to say, a diminition of the number of pulses recorded by the detector for a source which irradiates constantly) and on the other hand, a shift of the spectrum in time towards the lower energies which leads to a degradation of the resolution since the peaks are displaced during the time of storage.

The invention eliminates the polarization phenomena by means of a particular treatment of the surfaces of the CdTe crystal leading to the realization of suitable contacts.

According to a first embodiment of the treatment of cadmium telluride crystals, the surface of the material is first mechanically treated (grinding or fine polishing) then chemically (for example, scouring with bromomethanol). In addition, according to the treatment process, there is realized a superficial oxidation of the faces of the crystal in order to reduce the prohibitive leakage current existing in the chemically treated diodes to acceptable values. Finally, there is deposited on each of the faces of the crystal at least one layer of a material which is highly electrically conductive. There is thus realized a final structure of the MOS type (metal-oxide-semi-conductor).

The MOS structure allows elimination of all polarization phenomena. The obtention of one such structure can, nevertheless, in certain cases run into difficulties and it is preferred to be able to provide a process more generally leading to the complete elumination of polarization phenomena by diverse modes of realization conferring to it a great simplicity of use.

A more general process for treatment of cadmium telluride crystals for nuclear detectors according to the invention is characterized in that in a first step the surface of the material is mechanically treated by grinding or fine polishing. In a second step the surface of the material is chemically treated, and in the thin insulating layer surmounted by at least one layer of a highly conductive material. There is thus realized a final structure of the type MIS (metal of highly conductive material insulator-semi-conductor).

According to one embodiment of the invention, the third step of the process for treatment of cadmium telluride crystals defined hereinabove consists of depositing by evaporation on the mechanically and chemically treated faces a layer of an insulator and then depositing on these surfaces at least one layer of the conductive material.

According to another embodiment of the invention at the time of the third step of the treatment process there is realized a dopage by ionic implantation such that there is formed at the surface of the semi-conductor a thin insulating layer which surmounts the dopant which serves the role of a lightly conductive material.

The MIS structure as well as the MOS structure permits simultaneously the modification of the relation between the injected major and minor carriers and retains a small leakage current at the diode constituting the detector. It is necessary that the insulator layers as well as the oxide layers have a thickness of limited magnitude (about 100 A) in order that the carriers can pass through by tunnel effect.

The invention will become better understood from the following description referring to a non-limitative embodiment of a nuclear detector and to the treatment of cadmium telluride crystals as shown in the attached drawings.

DETAILED DESCRIPTION

Figure 3:
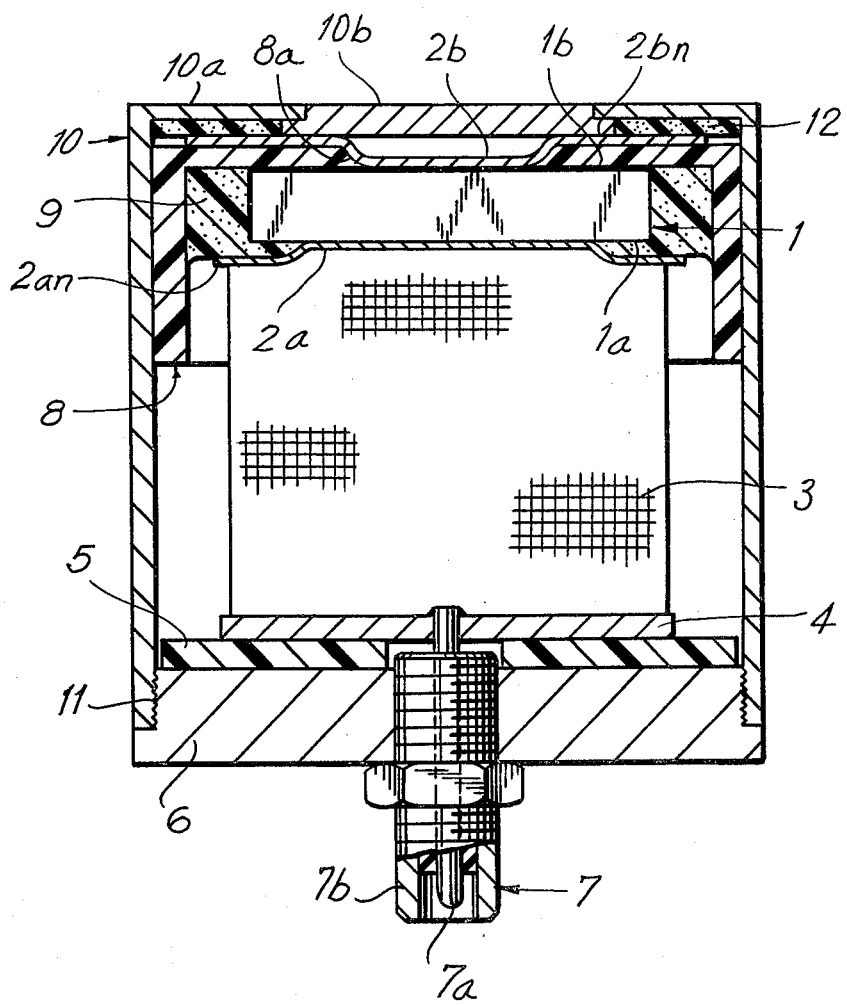
FIG. 3 is a sectional view of an embodiment of nuclear detector according to the invention.

Referring to FIG. 3, numeral designates a cadmium telluride crystal (CdTe) having two opposed parallel faces 1a, 1b, suitably treated and in intimate contact with electrodes 2a, 2b.

The base material of the crystal can be constituted by a material, doped or not, and need not necessarily have a microcrystalline structure. The crystal 1 can be formed from a number of crystals (not shown). Its resistivity will be sufficiently high to permit the realization of counters of high effectivity. The resistivity will be greater than about $10^5\Omega cm$.

The peripheral edged $2an$, $2bn$ of the electrodes $2a$, $2b$ are detached from the active faces $1a$, $1b$ for connection of the electrical contact points outside the crystal in order not to subject it to abnormal mechanical stresses. The electrodes $2a$, $2b$ are constituted by at least one layer of metallic material which is a good electrical conductor such as silicon, copper, silver, gold, platinum, palladium or their alloys. The metallic material can be in the form of deposits of single or multilayers.

The crystal 1 rests via first electrode $2a$ on a woven cushion 3 of gilded bronze filaments whose lower surface is in contact with a conductive plate 4 which in turn bears through the intermediary of an insulative plate 5 on a conductive base 6 serving for support of the detector.

The plate 4 is connected to a central pole $7a$ of a miniature axial connector 7 whose body $7b$ (the other pole) is secured to the base 6.

A cap 8 of insulating material such as Araldite is placed on the edge of the face $1b$ and a concentric opening $8a$ exposes the second electrode $2b$ whose edge $2bn$ is on the cap 8. A space 9 left between the crystal 1, the edge $2an$ and the cap 8 is filled by an epoxy resin.

A casing 10 is disposed on the assembly of the juxtaposed pieces described hereinabove and the casing is fixed to the base 6, for example, by means of threaded connection 11.

A seal 12 of ultra-conductive silicone rubber is interposed between wall $10a$ of casing 10 and the second electrode $2b$ which permits, on the one hand, a reasonable mechanical sealing of the juxtaposed pieces through the intermediary of the casing 10 secured to the base 6 and, on the other hand, conduction between the second electrode $2b$ and the casing 10.

The wall $10a$ has a window $10b$ mounted therein and formed by a thin sheet of aluminum or of metallized nylon adapted to the type of ray that it is desired to detect.

The electrical circuit of the detector is established between the central pole $7a$, the plate 4 (insulated from the base 6 by the plate 5) the cushion 3, the first electrode $2a$, the crystal 1, the second electrode $2b$, the conductive seal 12, the casing 10, the base 6 and the body $7b$ of the connector 7.

The detector according to FIG. 3 is therefore a p-n junction or a solid ionization chamber prepared from a crystal of cadmium telluride of suitable size and polarized by means of the two electrodes.

In respect of the semi-conductor detector, the crystal will furnish a response to alpha, beta and gamma rays by directly collecting the pairs of free electrons by the incident rays, and it will respond to the action of thermal neutrons by the nuclear reaction induced in the counter.

As a consequence, the invention allows realization of a detector sensitive to the four types of rays.

The invention is also directed to a process of preparation of the crystal 1 which after cutting receives surface treatments adapted to reduce the leakage current of the diode and the dielectric polarization phenomena.

According to a first embodiment, the process contemplates a grinding and fine polishing of the two opposite and parallel active faces $1a$, $1b$ of the crystal 1 of cadmium telluride (CdTe) followed by a chemical treatment of the $1a$, $1b$, for example, by a solution of methanol-bromine in suitable concentration. Then, the faces $1a$, $1b$ are superficially oxidized, for example, by means of oxygenated water in order to reduce the leakage current which becomes prohibitive after the chemical treatment to acceptable values for voltages of several hundred volts.

The material of the electrodes $2a$, $2b$ is deposited on each of the faces $1a$, $1b$, of the crystal 1 in the form of one or a plurality of layers of a highly conductive material.

The electrodes of conductive material can be selected from the group consisting of silicon, copper, platinum, gold, palladium and their alloys which are particularly advantageous.

The highly conductive material is deposited on each of the active faces of the crystal by a process known in and of itself such as the vacuum metallization or chemical deposits.

According to another embodiment of the process of treatment of the cadmium telluride crystal, after cutting first a grinding and a fine polishing of the opposite and parallel faces of the crystal which will constitute the active faces is obtained, then the two faces of the crystal are chemically scoured, for example, with a solution of nitric acid and potassium or sodium bichromate, or with a solution of methanol-bromine, there is then disposed on the treated surfaces, by a known process, such as evaporation, a layer of an insulator, for example, silicon oxide in the form of $SiO$ or directly of silicon, these being oxidized by air to $SiO_2$ which is an insulator, and finally there is deposited on the treated surfaces, as in the first embodiment, any conductive material whatever, for example, aluminum in order to constitute the electrodes.

According to another embodiment of the treatment process of the cadmium telluride crystal, after the steps of mechanical and chemical treatment which are the same as those described in the previous embodiments, there is effected on the two active faces of the crystal a dopage by ionic implantation.

Under the effect of ionic bombardment there is created faults in the semi-conductors such that they progressively tend towards the formation of a small insulating zone.

The dopant material which penetrates a little less deeply than the faults into the interior of the semi-conductor material thus constitutes a conductive layer which is superimposed on the thin insulating layer formed on each of the faces of the crystal and there is thus formed a structure of MIS type.

The dopant can be, for example, bismuth or materials introducing deep levels in the forbidden gap.

Once treated according to the processes described hereinabove the cadmium telluride crystal incorporated in the nuclear detector no longer presents polarization phenomena. The effectivity of the detector is stable in time and the spectrum recorded is no longer subjected to displacement in time towards the lower energies.

In FIG. $1a$ it can be seen that a rapid diminution of the effectivity of the detector is obtained as a function of time for a crystal of cadmium telluride compounded with chlorine but not treated in accordance with the invention, that is to say, not having been subjected to the chemical treatment nor having received the insulating layer.

Figure 1A:
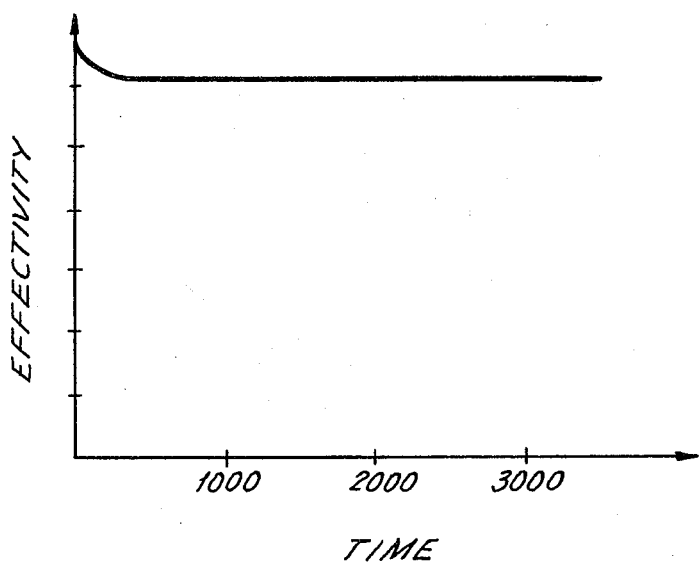
FIG. 1a is a graph showing the effectivity of a nuclear detector as a function of time for a crystal of untreated cadmium telluride.
Figure 1B:
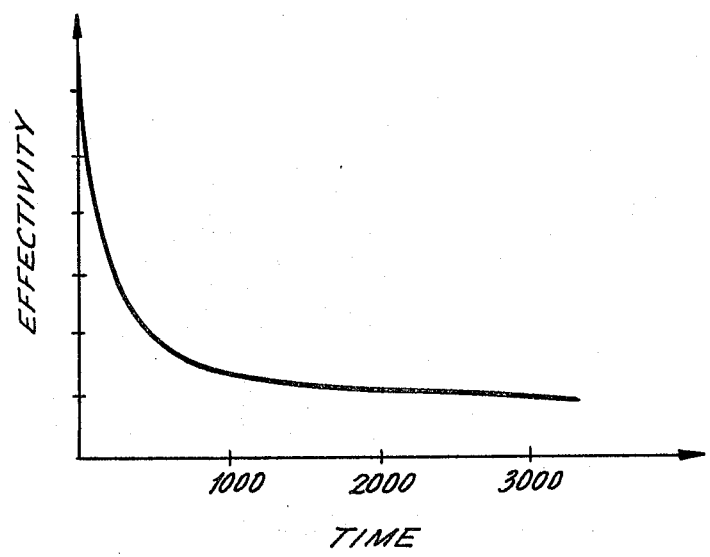
FIG. 1b shows a curve of the effectivity of a nuclear detector as a function of time for a crystal of cadmium telluride treated according to the invention.

FIG. 1b shows the effectivity of detection as a function of time for the same crystal but treated according to one of the embodiments of the process described above in which contacts of platinum are deposited on a layer of silicon preliminarily deposited on the active faces of the mechanically and chemically treated crystal.

Figure 2A:
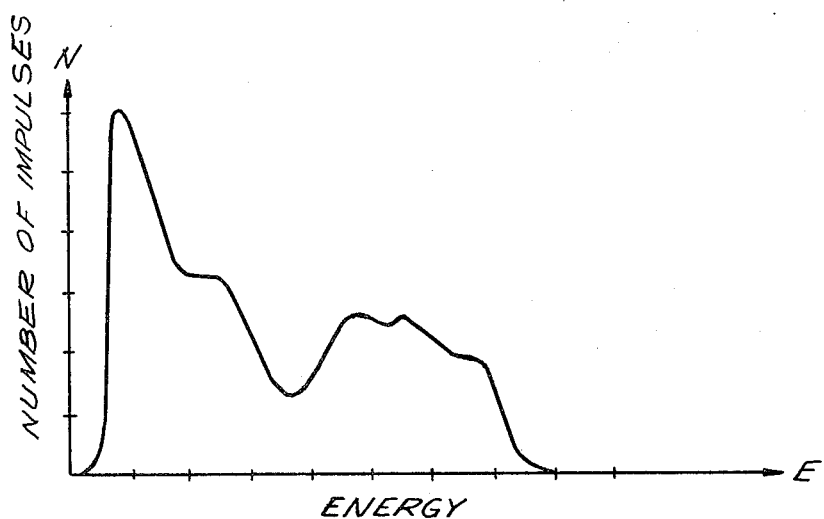
FIG. 2a shows the spectrum of $57_{Co}$ at the instant of initial application of voltage to the detector with a non-treated crystal.
Figure 2B:
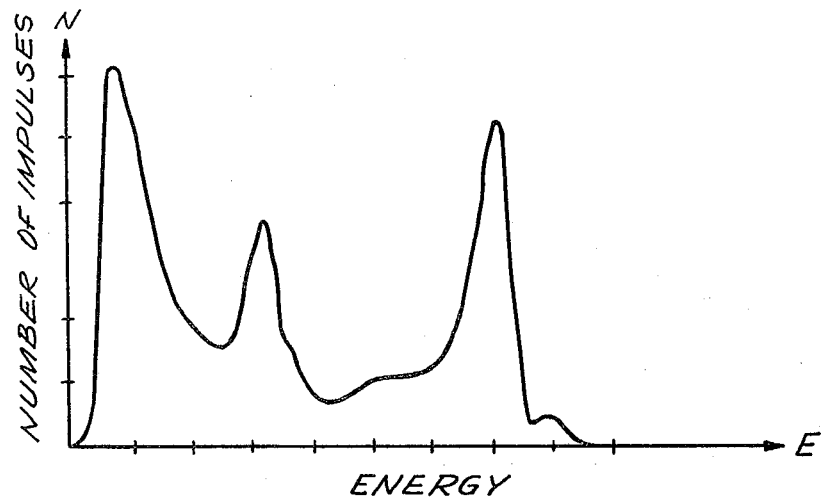
FIG. 2b shows the spectrum of $57_{Co}$, obtained with the same treated crystal as that utilized for FIG. 2b but at the end of one hour of operation of the detector.
Figure 2C:
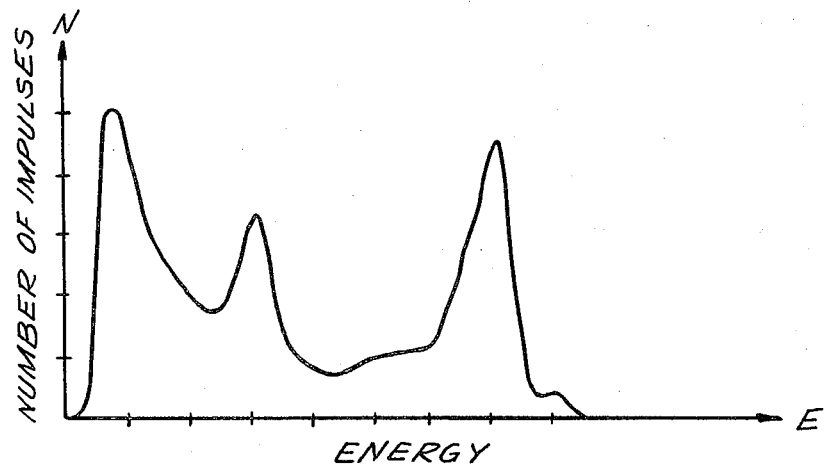

The curves of FIGS. 2a, 2b and 2c representing the spectrum $^{57}$Co gives the number N of impulses received by the detector as a function of the energy E of the ray. The scales are established in arbitrary units.

FIG. 2a shows the spectrum of $^{57}$Co at the initial time when the detector is placed under voltage for a non-treated crystal.

FIG. 2b shows the spectrum of $^{57}$Co at the initial time of energization of the detector but for the same crystal treated according to the process of the invention.

It is noted that the peaks are much cleaner and much higher in FIG. 2b.

FIG. 2C shows the same spectrum of $^{57}$Co obtained with the same treated crystal according to the process of the invention but at the end of one hour of operation of the detector. It is noted that the spectrum is stable with respect to that of FIG. 2b.

What is claimed is:

1. In a nuclear detector sensitive to alpha, beta and gamma rays as well as thermal neutrons comprising;
   a semi-conductor crystal having opposite parallel faces,
   first and second electrodes disposed on respective parallel faces of said crystal,
   a conductive support base for said detector,
   an insulating plate on said base,
   a conductive plate on said insulating plate,
   an elastic contact element mounted between the first of the electrodes and said conductive plate,
   a coaxial connector mounted in said base and including a central pole connected to said conductive plate and a surrounding pole connected to said base,
   a conductive casing mounted on said base,
   a window supported in said casing opposite said crystal,
   insulator means for maintaining and centering the crystal in said conductive casing and
   seal means of elastic and conductive material interposed between the window and surrounding the second electrode,
   the improvement wherein said semi-conductor crystal is a crystal of cadmium telluride (CdTe) of high resistivity.

2. The improvement according to claim 1 wherein said elastic element is a woven cushion of gilded bronze filament.

3. The improvement according to claim 1 wherein the cadmium telluride crystal is treated by the steps comprising
   grinding and fine polishing the opposite parallel faces of the crystal,
   chemically scouring said faces,
   superficially oxidizing said faces, and
   depositing on each of said faces at least one layer of a material which is a good electrical conductor.

4. The improvement for treatment of a cadmium telluride crystal for a nuclear detector according to claim 1 comprising
   grinding and fine polishing the opposite parallel faces of the crystal,
   chemically scouring said faces,
   forming an insulating layer on said faces, and
   forming on said faces at least one layer of a material which is highly electrically conductive.

5. The improvement according to claim 4 wherein the insulating layer as well as the layer of highly conductive material is formed by deposit on said faces.

6. The improvement according to claim 4 wherein the insulating layer as well as the layer of highly conductive material is formed by ionic implantation on said faces.

7. The improvement according to claim 4 wherein the insulating layer has a thickness of 100 A.

8. The improvement according to claim 5 wherein the insulating layer has a thickness of 100 A.

9. The improvement according to claim 6 wherein the insulating layer has a thickness of 100 A.

10. The improvement according to claim 4 wherein the insulating layer is formed by depositing a layer of silicon or silicon oxide on the faces which are placed into contact with air to evolve into an insulating compound.

* * * * *